(12) United States Patent
Wang et al.

(10) Patent No.: US 8,238,395 B2
(45) Date of Patent: Aug. 7, 2012

(54) AUTOMATIC POWER CONTROL (APC) LOOP FOR ADJUSTING THE BIAS CURRENT OF A LASER DIODE

(75) Inventors: Chih-yang Wang, Hsinchu (TW); Chi-Ping Wang, Hsinchu (TW)

(73) Assignee: TM Technology, Inc., Hsinchu (TW)

( * ) Notice: Subject to any disclaimer, the term of this patent is extended or adjusted under 35 U.S.C. 154(b) by 0 days.

(21) Appl. No.: 13/185,698

(22) Filed: Jul. 19, 2011

(65) Prior Publication Data

US 2012/0051379 A1    Mar. 1, 2012

(30) Foreign Application Priority Data

Aug. 27, 2010   (TW) .............................. 99128799 A (51) Int. Cl.
  *H01S 3/00*   (2006.01)
(52) U.S. Cl. .................................... 372/38.01
(58) Field of Classification Search ............... 372/38.01
  See application file for complete search history.

(56) References Cited

U.S. PATENT DOCUMENTS

2002/0114365 A1*  8/2002  Gilliland et al. ............ 372/38.02
2007/0098027 A1*  5/2007  Saitoh et al. ............. 372/29.011

* cited by examiner

*Primary Examiner* — Patrick Stafford
(74) *Attorney, Agent, or Firm* — Muncy, Geissler, Olds & Lowe, PLLC (57) ABSTRACT

A automatic power control loop comprises a photo diode used for sensing a light intensity of a laser diode to generate a feedback current, a switch selector used for selecting one among a plurality of predetermined currents according to a control signal generated by a controller, a transducer used for transferring a current different between the feedback current and the selected predetermined current into a load voltage, a comparator used for comparing the load voltage with a reference voltage to generate a comparison signal, a counter used for counting a count value according to the comparison signal and the control signal, and a laser diode driver used for generating a corresponding bias current in response to the count value to drive the laser diode. Thereby, the bias current will be adjusted within an allowable range, so that the light source of the laser diode can maintain a constant light intensity.

12 Claims, 5 Drawing Sheets

AUTOMATIC POWER CONTROL (APC) LOOP FOR ADJUSTING THE BIAS CURRENT OF A LASER DIODE

FIELD OF THE INVENTION

The present invention is related to an automatic power control loop for adjusting the bias current of a laser diode, where the feedback of the bias current used for operating the laser diode will be adjusted to an allowable range, so that the light source of the laser diode can maintain a constant light intensity.

BACKGROUND OF THE INVENTION

Common burst mode optical communication systems for conducting data communication through transmission of light signals by means of optical fibers are provided with a digital automatic power control loop (digital APC loop) that maintains a constant output light intensity of a light source. In said optical communication systems, it is commonplace to use a laser diode as the light source. The digital automatic power control loop is used for monitoring the output light source of the laser diode to adjust the bias current of the laser diode to a predetermined current value, such that the output light source of the laser diode can be maintained at a constant light intensity.

Figure 1:
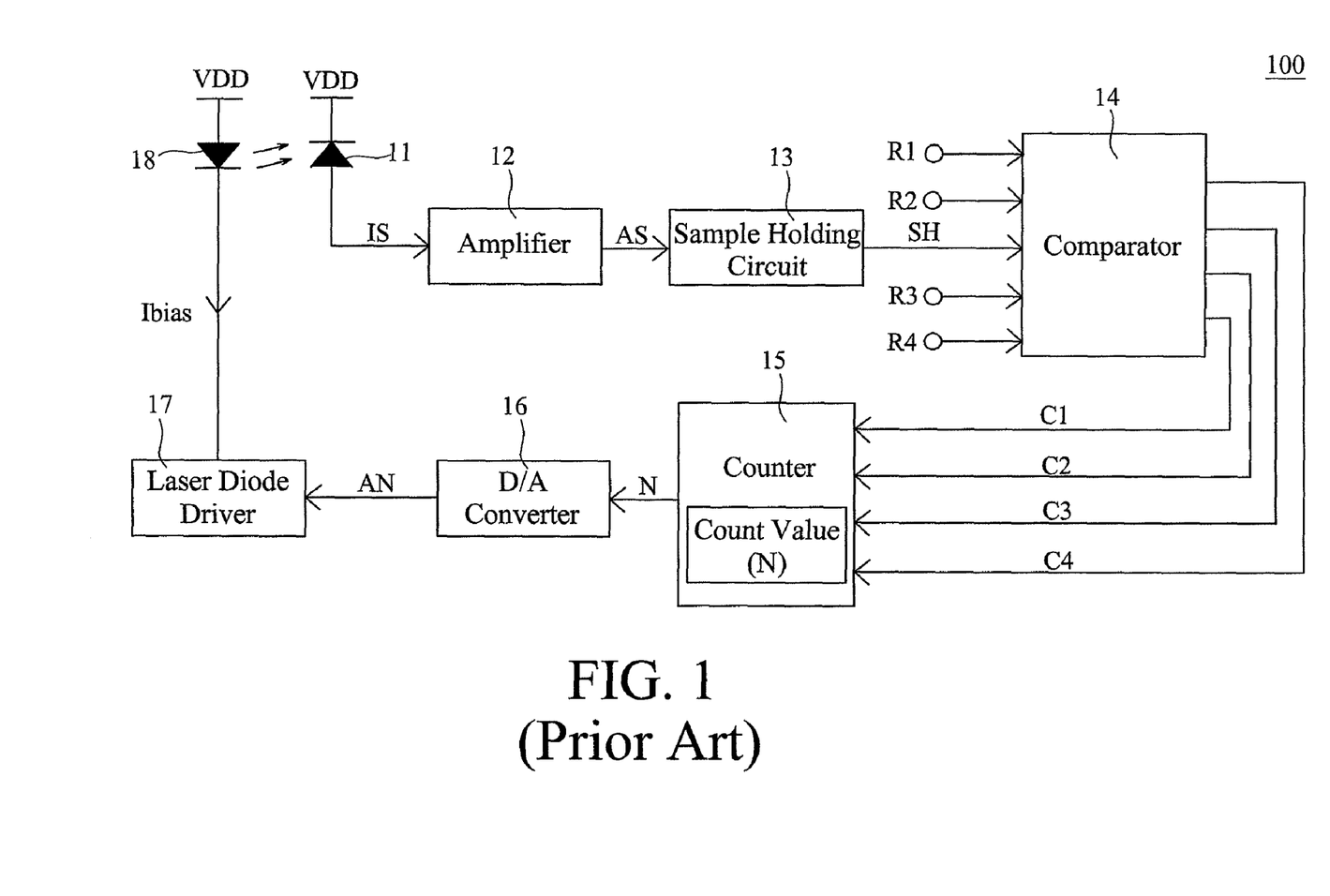
FIG. 1 is a circuit structure diagram for conventional digital automatic power control loop.

Referring to FIG. 1, there is shown a circuit structure diagram for conventional digital automatic power control loop. As shown in FIG. 1, the automatic power control loop 100 comprises a photo diode 11, an amplifier 12, a sample hold circuit 13, a comparator 14, a counter 15, a digital to analog (D/A) converter 16, a laser diode driver 17, and a laser diode 18.

Wherein, the photo diode 11 is used for sensing the light intensity of the laser diode 18 to generate a photoelectric signal (IS). The amplifier 12 is used for receiving and amplifying the photoelectric signal (IS) to generate an amplification signal (AS). The sample holding circuit 13 is used for receiving, sampling, and holding the amplification signal (AS) to generate a sample holding signal (SH).

The automatic power control loop 100 provides four different reference voltages R1, R2, R3, R4 (e.g., R1>R2>R3>R4), and sets a target value equal to the intermediate value between the reference voltage R2 and R3. The comparator 14 is used for receiving the sample holding signal (SH), and comparing the sample holding signal (SH) with each of the reference voltages R1, R2, R3, R4, respectively, to generate four count control signals (C1, C2, C3, C4) with digital forms; thereafter, the count control signals (C1, C2, C3, C4) will be transmitted to the counter 15.

When the sample holding signal (SH) is greater than the reference voltage R1, the comparator 14 generates the count control signals (C1C2C3C4=1100). When the sample holding signal (SH) is between the reference voltage R1 and R2, the comparator 14 generates the count control signals (C1C2C3C4=0100). When the sample holding signal (SH) is between the reference voltage R2 and R3, the comparator 14 generates the count control signals (C1C2C3C4=0000). When the sample holding signal (SH) is between the reference voltage R3 and R4, the comparator 14 generates the count control signals (C1C2C3C4=0010). When the sample holding signal (SH) is less than the reference voltage R4, the comparator 14 generates the count control signals (C1C2C3C4=0011).

The counter 15 comprises a default count value (N), and counts the count value (N) according to the count control signals (C1C2C3C4). The count value (N) is counted down by "2" when the count control signals (C1C2C3C4) are equal to 1100. The count value (N) is counted down by "1" when the count control signals (C1C2C3C4) are equal to 0100. The count value (N) is no counting operation to maintain the original value when the count control signals (C1C2C3C4) are equal to 0000. The count value (N) is counted up by "1" when the count control signals (C1C2C3C4) are equal to 0010. The count value (N) is counted up by "2" when the count control signals (C1C2C3C4) are equal to 0011.

Subsequently, the digital to analog converter 16 is used for receiving the count value (N) outputted from the counter 15, converting the count value (N) with a digital form into a count value (AN) with an analog form, and supplying the count value (AN) with the analog form to the laser diode driver 17.

The laser diode driver 17 is used for receiving the count value (AN), and thereby generates a bias current (Ibias) relative to the size of the count value (AN) to operate the laser diode 18 such that the light is emitted from the laser diode 18.

The automatic power control loop 100 is used for monitoring the light intensity of the laser diode 18 though the photo diode 11 to gradually adjust the feedback signal (e.g., the sample holding signal (SH)) to the target value, such that the bias current (Ibias) can also be adjusted to a predetermined current value. Thereafter, the light source of the laser diode 18 can be maintained at a constant light intensity so that the transmission of data in the optical communication system may be accurately.

Although, the automatic power control loop 100 of the prior art can adjust the bias current (Ibias) to a predetermined current value by the negative feedback. However, the sample holding signal (SH), which is used to indicate the light intensity of the laser diode 18, must be compared with the reference voltage R1, R2, R3, R4 simultaneously so as to observe whether the bias current (Ibias) is equal to the predetermined current or not. In such a way, the circuit complexity and power consumption of the comparator 14 will increase because of the complicated comparative procedure, which is unfavorable for the circuit development and circuit application of the automatic power control loop 100.

SUMMARY OF THE INVENTION

It is one object of the present invention to provide an automatic power control loop for adjusting the bias current of a laser diode, wherein the automatic power control loop is a creative circuit architecture and used for monitoring the light intensity of the laser diode to adjust the bias current to an allowable range by the negative feedback, thereafter, the adjusted bias current can be adopted for operating the laser diode, so that the output light of the laser diode can be maintained at a constant light intensity.

It is another object of the present invention to provide an automatic power control loop for adjusting the bias current of a laser diode, where a plurality of predetermined currents is provided and compared with the feedback current, which allows the bias current to be lowered when the feedback current is greater than the predetermined current's upper limit and raised when the feedback current is less than the predetermined current's lower limit, so that the bias current used for operating the laser diode can be adjusted to an allowable range.

It is a further object of the present invention to provide an automatic power control loop for adjusting the bias current of a laser diode, wherein the automatic power control loop sets a predetermined comparative number of times, the bias current can be lowered or raised by the automatic power control loop if all comparative results indicate the bias current greater than the predetermined current's upper limit or less than the predetermined current's lower limit through multiple comparisons for the predetermined comparative number of times, so as to prevent the bias current adjusted in a short period of time because of the noise and therefore increase the stability of the operating power of the laser diode.

To achieve the above objects, the present invention provides an automatic power control loop for adjusting the light intensity of a laser diode, comprising: a laser diode, used for receiving a bias current; a photo diode, connected to a first node, and used for sensing the light intensity of the laser diode to generate a feedback current that is equal to said bias current; a controller, used for outputting a control signal; a switch selector, disposed between the first node and a plurality of predetermined currents, comprising a plurality of switches, and connected to the controller to receive the control signal, wherein each of the predetermined currents corresponds to one among the switches respectively, wherein one among the predetermined currents is selected according to the control signal, and one among the switches corresponding to the selected predetermined current is turned on, such that the selected predetermined current is electrically connected to the first node; a transducer, connected to the first node, used for receiving a current difference between the feedback current and the selected predetermined current, and transferring the current difference into a load voltage; a comparator, connected to the transducer and the controller, and comprising a first input terminal and a second input terminal, wherein the first input terminal of the comparator is connected to a reference voltage, and the second input terminal of the comparator is used for receiving the load voltage, wherein the comparator is used for generating a comparison signal according to the comparison result of the load voltage and the reference voltage, then the comparison signal is transmitted to the controller, and thereby the controller changes the signal state of the control signal according to the comparison signal so as to decide the selected predetermined current; a counter, connected to the comparator and the controller to receive the comparison signal and the control signal, and used for recording and counting a count value, wherein the count value is counted up, counted down, or maintained at an original value according to the comparison signal and the control signal; and a laser diode driver, connected to the counter and the laser diode, and used for receiving the count value so as to generate the bias current relative to the count value.

DETAILED DESCRIPTION OF THE INVENTION

Figure 2:
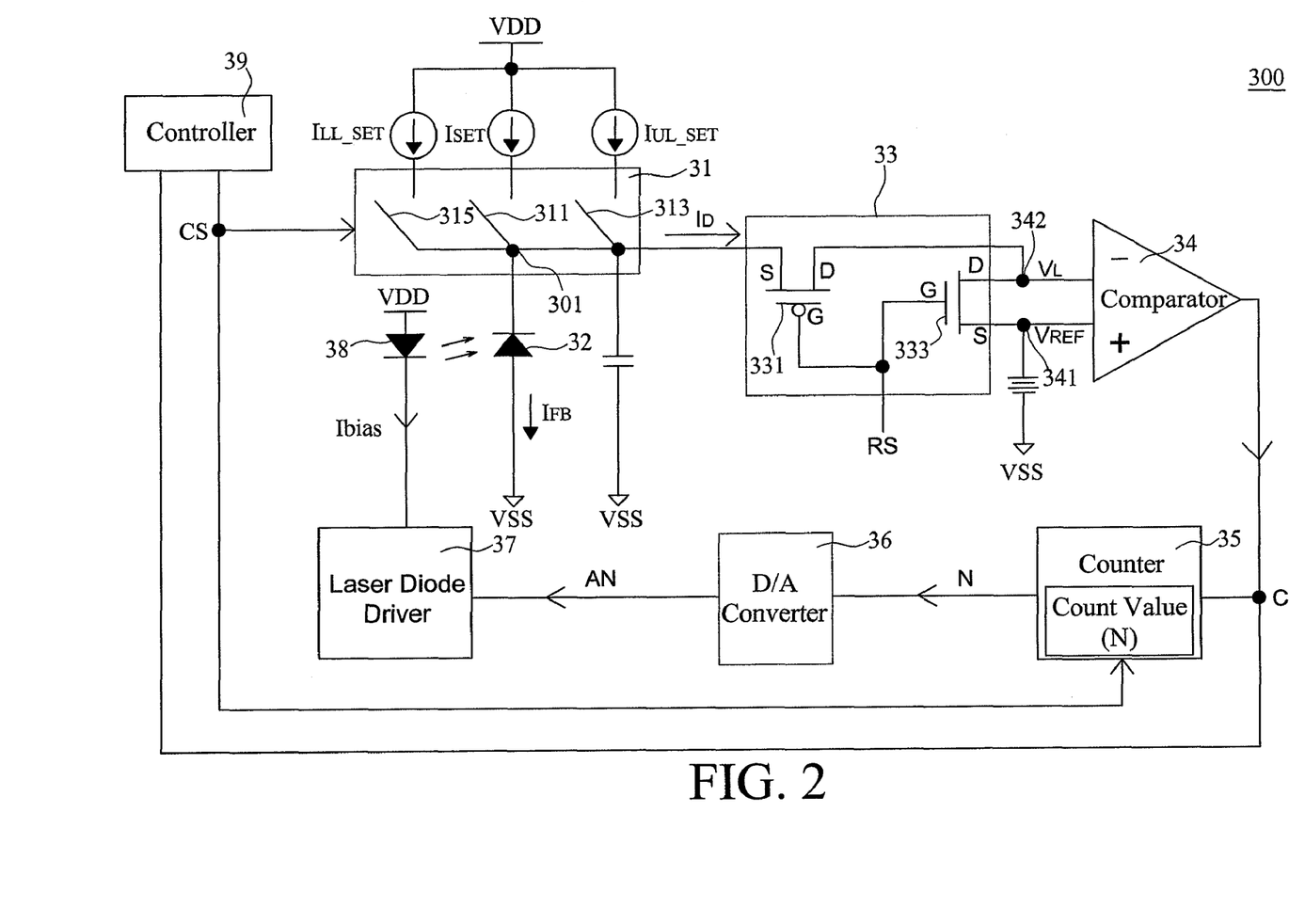
FIG. 2 is a circuit structure diagram for the automatic power control loop according to a preferred embodiment of the present invention.

Referring to FIG. 2, there is shown a circuit structure diagram for the automatic power control loop according to a preferred embodiment of the present invention. The present invention provides an automatic power control loop 300 that will be applied to adjust the light intensity of the light signal in a burst mode optical communication system. As shown in FIG. 2, the automatic power control loop 300 comprises a switch selector 31, a photo diode 32, a transducer 33, a comparator 34, a counter 35, a laser diode driver 37, a laser diode 38, and a controller 39.

Wherein, the laser diode 38 functioning as a light source in the optical communication system is operated by receiving a bias current (Ibias). The photo diode 32 is used for sensing the light intensity of the laser diode 38 to generate a feedback current ($I_{FB}$) equal to the bias current (Ibias), and is connected to a first node 301. The first node 301 is the connection point between the photo diode 32 and the switch selector 31.

The switch selector 31 is disposed between the first node 301 and a plurality of predetermined currents ($I_{SET}$', $I_{UL\_SET}$, $I_{LL\_SET}$), and comprises a plurality of switches 311, 313, 315. Each of the predetermined currents ($I_{SET}$, $I_{UL\_SET}$, $I_{LL\_SET}$) corresponds to one among the switches 311, 313, 315, respectively. The switch selector 31 is further connected to the controller 39 to receive a control signal (CS) generated by the controller 39. One among the predetermined currents ($I_{SET}$, $I_{UL\_SET}$, $I_{LL\_SET}$) is selected according to the control signal (CS), and then one among the switches 311/313/315 that corresponds to the selected predetermined current ($I_{SET}$/$I_{UL\_SET}$/$I_{LL\_SET}$) is turned on, such that the selected predetermined current ($I_{SET}$/$I_{UL\_SET}$/$I_{LL\_SET}$) is electrically connected to the first node 301. A current difference $I_D$ between the feedback current $I_{FB}$ and the selected predetermined current ($I_{SET}$/$T_{UL\_SET}$/$I_{LL\_SET}$) is outputted from the first node 301. The current difference $I_D$ can be used to indicate whether the feedback current $I_{FB}$ is greater or less than the selected predetermined current ($I_{SET}$/$I_{UL\_SET}$/$I_{LL\_SET}$).

The predetermined currents comprise a predetermined reference current ($I_{SET}$), a predetermined upper limit current ($I_{UL\_SET}$), and a predetermined lower limit current ($I_{LL\_SET}$). The predetermined reference current ($I_{SET}$) corresponds to the switch 311, the predetermined upper limit current ($I_{UL\_SET}$) corresponds to the switch 313, and the predetermined lower limit current ($I_{LL\_SET}$) corresponds to the switch 315. The predetermined upper limit current ($I_{LL\_SET}$) can be set to 1.2× the predetermined reference current ($I_{SET}$) or another multiple (such as >1), and the predetermined lower limit current ($I_{LL\_SET}$) can be set to 0.8× the predetermined reference current ($I_{SET}$) or another multiple (such as <1). The control signal (CS) generated by the controller 39 comprises three signal states, such as a first signal state (00), a second signal state (01), and a third signal state (10). When the signal state of the control signal (CS) is at the first signal state (00), the switch 311 is turned on so as to select the predetermined reference current ($I_{SET}$) connected to the first node 301. When the signal state of the control signal (CS) is at the second signal state (01), the switch 313 is turned on so as to select the predetermined upper limit current ($I_{UL\_SET}$) connected to the first node 301. When the signal state of the control signal (CS) is at the third signal state (10), the switch 315 is turned on so as to select the predetermined lower limit current ($I_{LL\_SET}$) connected to the first node 301.

The transducer 33 is connected to the first node 301, and is used for receiving the current difference $I_D$ outputted from the first node 301 to transfer the current difference $I_D$ into a load voltage $V_L$. The comparator 34 comprises a first input terminal 341, a second input terminal 342, and an output terminal. The first input terminal 341 of the comparator 34 is connected to a reference voltage $V_{REF}$, the second input terminal 342 of the comparator 34 is connected to the transducer 33 to receive the load voltage $V_L$, and the output terminal of the comparator 34 is connected to the counter 35 and the controller 39. The comparator 34 is used for comparing the load voltage $V_L$ with the reference voltage $V_{REF}$ to generate and output a comparison signal (C) from the output terminal thereof. The comparison signal (C) is a negative saturation signal (C=−1) when the load voltage $V_L$ is greater than the reference voltage $V_{REF}$, a zero value signal (C=0) when the load voltage $V_L$ is equal to the reference voltage $V_{REF}$, and a positive saturation signal (C=+1) when the load voltage $V_L$ is less than the reference voltage $V_{REF}$.

The detailed circuit structure of transducer 33 comprises a first transistor 331 and a second transistor 333. The source of the first transistor 331 is connected to the first node 301, the drain is connected to the second input terminal 342 of the comparator 34, and the gate is used for receiving a reset signal (RS); moreover, the first transistor 331 is a PMOS transistor. The source of the second transistor 333 is connected to the first input terminal 341 of the comparator 34, the drain is connected to the second input terminal 342 of the comparator 34, and the gate is used for receiving the reset signal (RS); moreover, the second transistor 333 is an NMOS transistor. When the reset signal (RS) is at a high-level state (H), the first transistor 331 is turned off and the second transistor 333 is turned on, and the first input terminal 341 and the second input terminal 342 of comparator 34 are connected together through the transducer 33 to control the load voltage $V_L$ equal to the reference voltage $V_{REF}$. Oppositely, when the reset signal (RS) is at a low-level state (L), the first transistor 331 is turned on and the second transistor 333 is turned off, and the current difference $I_D$ between the feedback current $I_{FB}$ and the selected predetermined current ($I_{SET}/I_{UL\_SET}/I_{LL\_SET}$) will flow into the transducer 33 so as to generate the load voltage $V_L$ on the second input terminal 342 of the comparator 34.

The comparison signal (C) generated by the comparator 34 is transmitted to the controller 39. The controller 39 changes the signal state of the control signal (CS) according to the comparison signal (C) so as to choose one among the predetermined currents ($I_{SET}$, $I_{UL\_SET}$, $I_{LL\_SET}$). The counter 35 is a digital counter (for example, a 10-bit counter), used for recording and countering a counter value (N), and connected to the comparator 34 and the controller 39 to receive the comparison signal (C) and the control signal (CS). Wherein the counter value (N) is counted up, counted down, or maintained at the original value according to the comparison signal (C) and the control signal (CS).

The laser diode driver 37 is connected to the counter 35 and the laser diode 38, used for receiving the adjusted count value (N) from the counter 35, and thus generating a bias current (Ibias) relative to the adjusted count value (N) to operate the laser diode 38 light emitting. In the present embodiment, the laser diode driver 37 can receive the count value (N) with a digital form directly from the counter 35 to generate a bias current (Ibias) via digital processing. Or, a digital to analog converter 36 may be disposed between the counter 35 and the laser diode driver 37, which can be used for converting the count value (N) with a digital form into a count value (AN) with an analog form. Then, the laser diode driver 37 will receive the count value (AN) with the analog form from the digital to analog converter 36 to generate a bias current (Ibias) via analog processing.

Therefore, the automatic power control loop 300 of the present embodiment adopts multiple predetermined currents ($I_{SET}$, $I_{UL\_SET}$, $I_{LL\_SET}$) to compare with the feedback current $I_{FB}$, so that the bias current (Ibias) will be lowered when the feedback current $I_{FB}$ is greater than the predetermined upper limit current ($I_{UL\_SET}$) or the bias current (Ibias) will be raised when the feedback current $I_{FB}$ is less than the predetermined lower limit current ($I_{LL\_SET}$). This is so that the bias current (Ibias) used for operating the laser diode 38 can be adjusted to an allowable range, thus allowing the light source of the laser diode 38 to maintain a constant light intensity.

The operating process of the controller 34 and the counter 35 will be further described in the following content:

The signal state of the control signal (CS) is pre-set as the first signal state (00) by the controlling of the controller 39 in order to pre-select the predetermined reference current ($I_{SET}$) to compare with the feedback current $I_{FB}$ before the automatic power control loop 300 commences the monitoring process for the light intensity of the laser diode 38.

The automatic power control loop 300 starts the monitoring process, and the output terminal of the comparator 34 will output a negative saturation signal (C=−1) to the counter 35 and the controller 39 when the feedback current $I_{FB}$ is greater than the predetermined reference current ($I_{SET}$). When the counter 35 receives the control signal (CS) with the first signal state (00) and a negative saturation signal (C=−1), it isn't counting operation for the count value (N). Moreover, the controller 39, by receiving a negative saturation signal (C=−1), will record that the present feedback current $I_{FB}$ is greater than the predetermined reference current ($I_{SET}$), at which point the controller 39 will change the signal state of the control signal (CS) from the first signal state (00) to the second signal state (01) to select another predetermined upper limit current ($I_{UL\_SET}$) compared with the feedback current $I_{FB}$. Thereafter, if the feedback current $I_{FB}$ is still greater than the predetermined upper limit current ($I_{UL\_SET}$), the output terminal of the comparator 34 will also output a negative saturation signal (C=−1) to the counter 35 and the controller 39. Subsequently, the count value (N) will be counted down by the counter 35 when the counter 35 receives the control signal (CS) with the second signal state (01) and a negative saturation signal (C=−1) simultaneously. Then, the controller 39 changes the signal state of the control signal (CS) from the second signal state (01) into the first signal state (00) to reselect the predetermined reference current ($I_{SET}$) compared with the feedback current $I_{FB}$ because of receiving a negative saturation signal (C=−1) again. The above procedure proceeds continuously until the controller 39 receives a positive saturation signal (C=+1) outputted by the comparator 34, which indicates that the adjusted feedback current $I_{FB}$ has already been less than the predetermined upper limit current ($I_{UL\_SET}$), such that the controller 39 can stop the change of the signal state of the control signal (CS) between the first signal state (00) and the second signal state (01), so that the counting process for the count value (N) can be completed.

Oppositely, the automatic power control loop 300 starts the monitoring process, and the output terminal of the comparator 34 will output a positive saturation signal (C=+1) to the counter 35 and the controller 39 when the feedback current $I_{FB}$ is less than the predetermined reference current ($I_{SET}$). When the counter 35 receives the control signal (CS) with the first signal state (00) and a positive saturation signal (C=+1), it isn't counting operation for the count value (N). Moreover, the controller 39, by receiving a positive saturation signal (C=+1), will record that the present feedback current $I_{FB}$ is less than the predetermined reference current ($I_{SET}$), at which point the controller 39 will change the signal state of the control signal (CS) from the first signal state (00) into the third signal state (10) to select another predetermined lower limit current ($I_{LL\_SET}$) compared with the feedback current $I_{FB}$. Thereafter, if the feedback current $I_{FB}$ is still less than the predetermined lower limit current ($I_{LL\_SET}$), the output terminal of the comparator 34 will also output a positive saturation signal (C=+1) to the counter 35 and the controller 39. Subsequently, the count value (N) will be counted up by the counter 35 when the counter 35 receives the control signal (CS) with the third signal state (10) and a positive saturation signal (C=+1) simultaneously. Then, the controller 39 changes the signal state of the control signal (CS) from the third signal state (10) into the first signal state (00) to reselect the predetermined reference current ($I_{SET}$) compared with the feedback current $I_{FB}$ because of receiving a positive saturation signal (C=+1) again. The above procedure proceeds continuously until the controller 39 can receive a negative saturation signal (C=−1) outputted by the comparator 34, which indicates that the adjusted feedback current $I_{FB}$ has already been greater than the predetermined lower limit current ($I_{LL\_SET}$), such that the controller 39 can stop the change of the signal state of the control signal (CS) between the first signal state (00) and the third signal state (10), so that the counting process for the count value (N) can be completed.

Further, the comparator 34 within the automatic power control loop 300 sets a predetermined comparative number of times, such as 16 times. The comparator 34 will output the negative saturation signal (C=−1) or the positive saturation signal (C=+1) if all comparative results indicate that the load voltage $V_L$ is greater or less than the reference voltage $V_{REF}$ through multiple comparisons for the predetermined comparative number of times. In other words, the automatic power control loop 300 will repeatedly confirm whether the bias current (Ibias) is greater than the upper limit current ($I_{UL\_SET}$) or less than the lower limit current ($I_{LL\_SET}$) so as to prevent the bias current (Ibias) continuously adjusted in a short period of time because of the noise and therefore increase the stability of the operating power of the laser diode 38.

Figure 3:
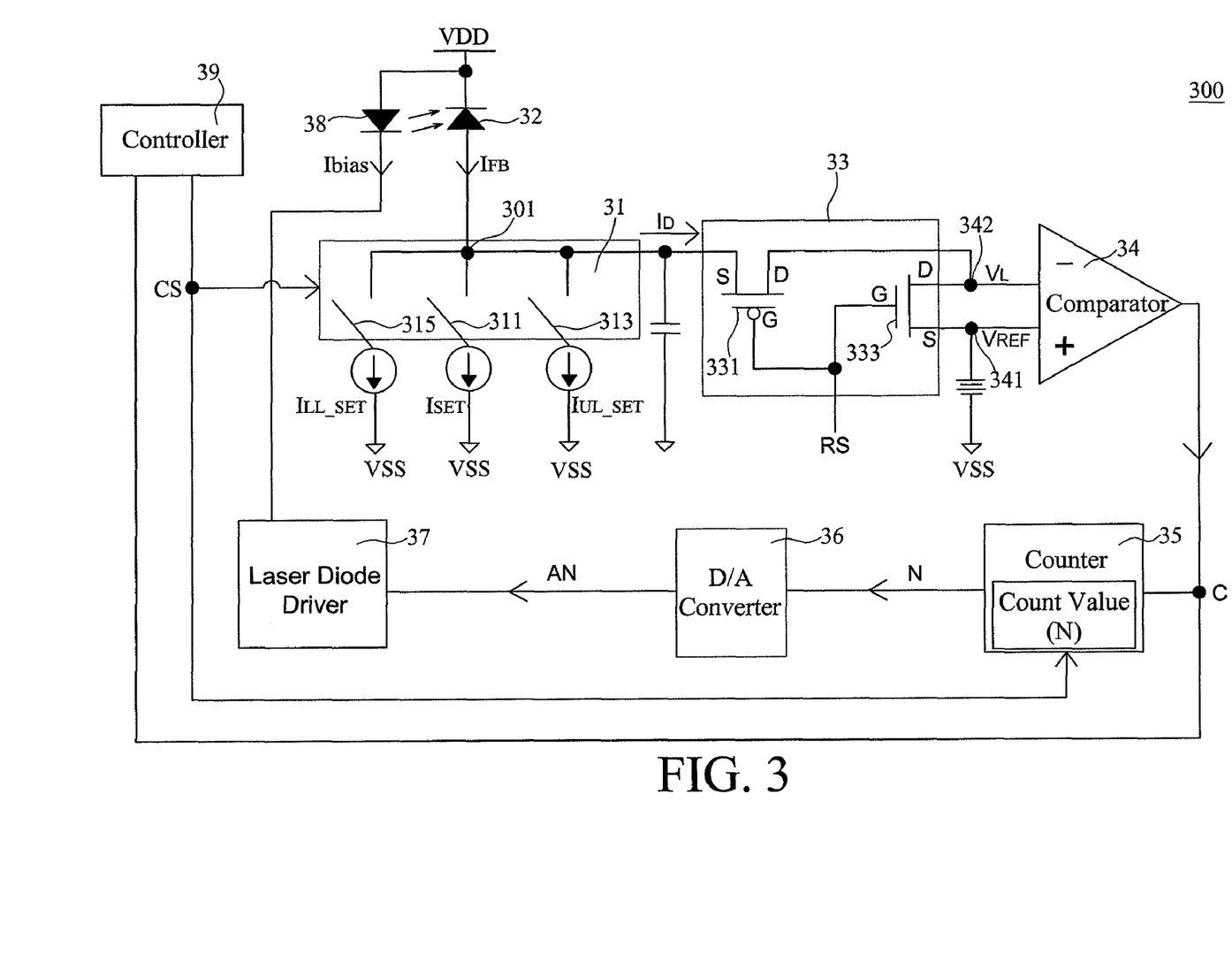
FIG. 3 is a circuit structure diagram for the automatic power control loop according to another embodiment of the present invention.

In the embodiment of present invention, the predetermined currents ($I_{SET}$, $I_{UL\_SET}$, $I_{LL\_SET}$) are connected to the first power source (VDD), and the photo diode 32 is connected to the second power source (VSS), as shown FIG. 2. Alternatively, in another embodiment of present invention, the photo diode 32 is connected to the first power source (VDD), and the predetermined currents ($I_{SET}$, $I_{UL\_SET}$, $I_{LL\_SET}$) are connected to the second power source (VSS), as shown in FIG. 3.

Figure 4:
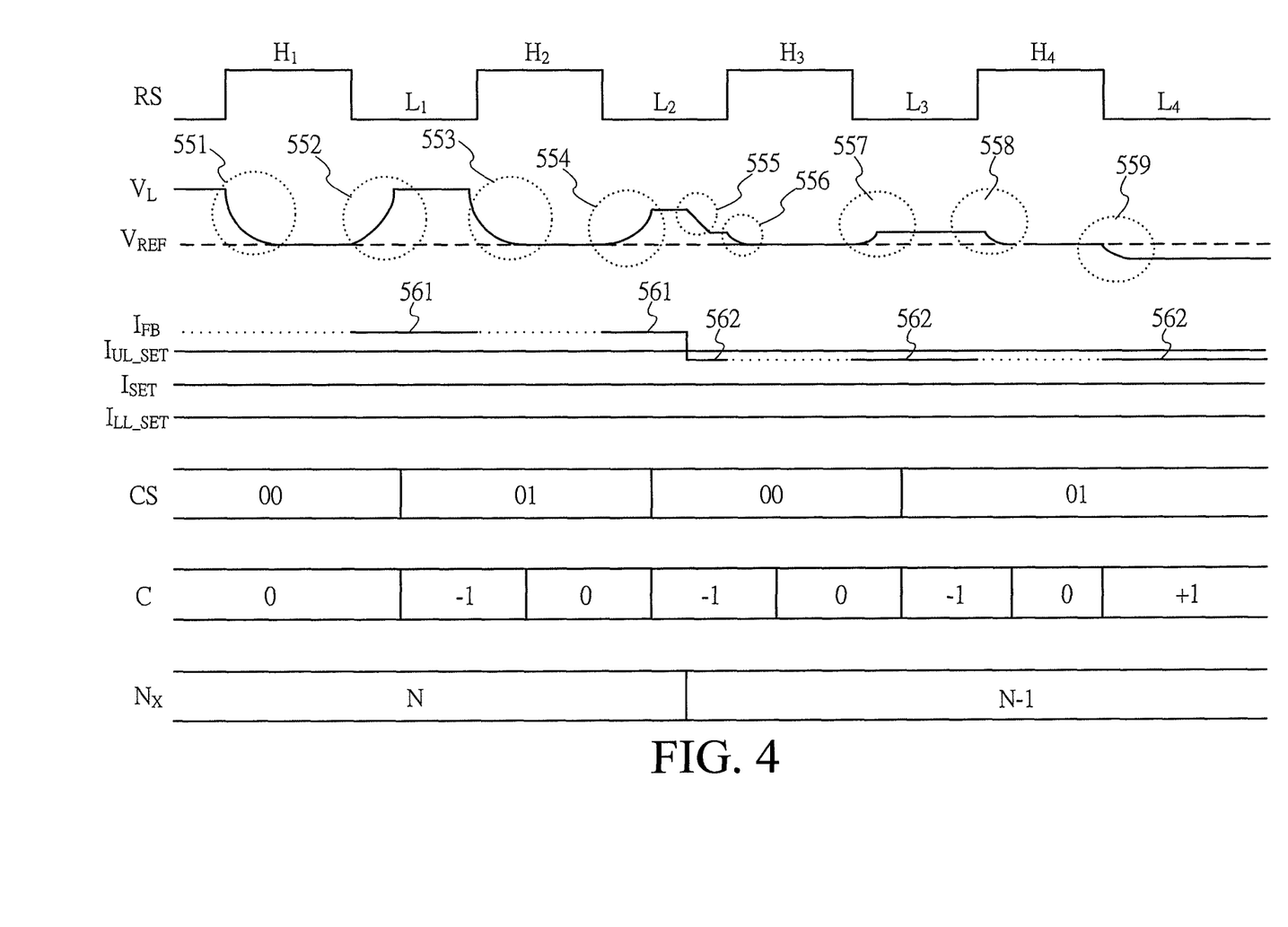
FIG. 4 is a timing diagram for the automatic power control loop according to one embodiment of the present invention.

Referring to FIG. 4, there is shown a timing diagram for the automatic power control loop according to one embodiment of the present invention, accompanying FIG. 2. As shown in FIG. 2 and FIG. 4, in the present invention, the signal state of the control signal (CS) is pre-set as the first signal state (00) by the controlling of the controller 39 in order to pre-select the predetermined reference current ($I_{SET}$) compared with the feedback current $I_{FB}$ before the automatic power control loop 300 proceeds the monitoring process for the light intensity of the laser diode 38.

The automatic power control loop 300 starts the monitoring process for the light intensity of the laser diode 38. Firstly, the automatic power control loop 300 will receive a reset signal (RS) with a high-level state ($H_1$) to control the voltage value 551 of the load voltage $V_L$ equal to the reference voltage $V_{REF}$, and the photo diode 32 will not sense the light intensity of the laser diode 38 nor generate any feedback current $I_{FB}$ during the high-level state ($H_1$). Thereafter, the automatic power control loop 300 will receive a reset signal (RS) with a low-level state ($L_1$), and the photo diode 32 will sense the light intensity of the laser diode 38 to generate the current value 561 of the feedback current $I_{FB}$ that is equal to the present bias current (Ibias). The current value 561 of the feedback current $I_{FB}$ will be compared with the predetermined reference current ($I_{SET}$).

In the present invention, the current difference $I_D$ between the current value 561 of the feedback current $I_{FB}$ and the predetermined reference current ($I_{SET}$) will raise the voltage value 552 for the load voltage $V_L$ due to the current value 561 of the feedback current $I_{FB}$ being greater than the predetermined reference current ($I_{SET}$). Then, the comparator 24 will output a negative saturation signal (C=−1) according to the comparative result that the raised voltage value 552 of the load voltage $V_L$ is greater than the reference voltage $V_{REF}$. The counter 35 will not proceed the counting operation for the count value (N) while it receives the control signal (CS) with the first signal state (00) and a negative saturation signal (C=−1). Moreover, the controller 39 records that the current value 561 of the feedback current $I_{FB}$ is greater than the predetermined reference current ($I_{SET}$) by first receiving a negative saturation signal (C=−1), at which point the controller 39 changes the signal state of the control signal (CS) from the first signal state (00) into the second signal state (01) to select another predetermined upper limit current ($I_{UL\_SET}$) compared with the current value 561 of the feedback current $I_{FB}$.

The automatic power control loop 300 will receive the reset signal (RS) with the next high-level state ($H_2$) to control the voltage value 553 of the load voltage $V_L$ equal to the reference voltage $V_{REF}$, and the photo diode 32 will not sense the light intensity of the laser diode 38 nor generate any feedback current $I_{FB}$ during the high-level state ($H_2$). Thereafter, the automatic power control loop 300 will receive the reset signal (RS) with the next low-level ($L_2$), and the photo diode 32 will sense the light intensity of the laser diode 38 to generate the current value 561 of the feedback current $I_{FB}$ that will be compared with the predetermined upper limit current ($I_{UL\_SET}$). The current difference $I_D$ between the current value 561 for the feedback current $I_{FB}$ and the predetermined upper limit current ($I_{UL\_SET}$) will raise the voltage value 554 for the load voltage $V_L$ due to the current value 561 of the feedback current $I_{FB}$ still being greater than the predetermined upper limit current ($I_{UL\_SET}$). Then, the comparator 24 will output a negative saturation signal (C=−1) according to the comparative result that the raised voltage value 554 of the load voltage $V_L$ is greater than the reference voltage $V_{REF}$. The count value (N) is counted down (such as N=N−1) by the counter 35 while the counter 35 receives the control signal (CS) with the second signal state (01) and a negative saturation signal (C=−1) simultaneously. The laser diode driver 37 will generate a lower bias current (Ibias) by receiving the count value (N=N−1) or the count value (AN=AN−1). The laser diode 38 is operated by the lowered bias current (Ibias), so the light intensity of the laser diode 38 will be weaker; further, the photo diode 32 will generate a lower current value 562 of the feedback current $I_{FB}$ by sensing the weaker light intensity of the laser diode 38, and the lower current value 562 of the feedback current $I_{FB}$ will be equal to the lowered bias current (Ibias). The current difference $I_D$ between the lower current value 562 of the feedback current $I_{FB}$ and the predetermined upper limit current ($I_{UL\_SET}$) will lower parts of the voltage value 555 for the load voltage $V_L$. In addition, the voltage value 555 of the load voltage $V_L$ is still greater than the reference voltage $V_{REF}$, and the comparator 34 will also output a negative saturation signal (C=−1) to the controller 39. The controller 39, by again receiving a negative saturation signal (C=−1), will recognize the present bias current (Ibias) that has already adjusted; therefore, the controller 39 changes the signal state of the control signal (CS) from the second signal state (01) into the first signal state (00) to reselect the predetermined reference current ($I_{SET}$) compared with the lower current value 562 of the feedback current $I_{FB}$.

The automatic power control loop 300 will receive the reset signal (RS) with the next high-level state (H$_3$) to control the voltage value 556 of the load voltage V$_L$ equal to the reference voltage V$_{REF}$, and the photo diode 32 will not sense the light intensity of the laser diode 38 nor generate any feedback current I$_{FB}$ during the high-level state (H$_3$). Thereafter, the automatic power control loop 300 will receive the reset signal (RS) with the next low-level (L$_3$), and the photo diode 32 will sense the light intensity of the laser diode 38 to generate the lower current value 562 of the feedback current I$_{FB}$ that will be compared with the predetermined reference current (I$_{SET}$). The current difference I$_D$ between the lower current value 562 for the feedback current I$_{FB}$ and the predetermined reference current (I$_{SET}$) will raise the voltage value 557 of the load voltage V$_L$ due to the lower current value 562 of the feedback current I$_{FB}$ still being greater than the predetermined reference current (I$_{SET}$), and thereby the comparator 24 will also output a negative saturation signal (C=−1) according to the comparative result that the raised voltage value 557 of the load voltage V$_L$ is greater than the reference voltage V$_{REF}$.

The counter 35 will not proceed the counting operation for the count value (N=N−1) while it receives the control signal (CS) with the first signal state (00) and a negative saturation signal (C=−1). Moreover, the controller 39, by receiving a negative saturation signal (C=−1), will recognize that the lower current value 562 of the feedback current I$_{FB}$ is still greater than the predetermined reference current (I$_{SET}$), at which point the controller 39 changes the signal state of the control signal (CS) from the first signal state (00) into the second signal state (01) to select another predetermined upper limit current (I$_{UL\_SET}$) compared with the lower current value 562 of the feedback current I$_{FB}$.

The automatic power control loop 300 will receive the reset signal (RS) with the next high-level state (H$_4$) to control the voltage value 558 of the load voltage V$_L$ equal to the reference voltage V$_{REF}$, and the photo diode 32 will not sense the light intensity of the laser diode 38 nor generate any feedback current I$_{FB}$ during the high-level state (H$_4$). Thereafter, the automatic power control loop 300 will receive the reset signal (RS) with the next low-level (L$_4$), and the photo diode 32 will sense the light intensity of the laser diode 38 to generate the lower current value 562 of the feedback current I$_{FB}$ that will be compared with the predetermined upper limit current (I$_{UL\_SET}$). The current difference I$_D$ between the lower current value 562 of the feedback current I$_{FB}$ and the predetermined upper limit current (I$_{UL\_SET}$) will lower the voltage value 559 of the load voltage V$_L$ due to the current value 562 of the feedback current I$_{FB}$ being less than the predetermined upper limit current (I$_{UL\_SET}$) already, and then the comparator 24 will output a positive saturation signal (C=+1) according to the comparative result that the lowered voltage value 559 of the load voltage V$_L$ is less than the reference voltage V$_{REF}$. The controller 39 will stop the change of the signal state of the control signal (CS) by receiving the positive saturation signal (C=+1), at which point the counting process for the count value (N=N−1) can be completed, and therefore the bias current (Ibias) used for operating the laser diode 38 has already been adjusted to an allowable range.

The above content of the present embodiment is simply described as follows: when the automatic power control loop 300 starts the monitoring process for the light intensity of the laser diode 38, the signal state of the control signal (CS) is pre-set as the first signal state (00) by the controlling of the controller 39 in order to pre-select the predetermined reference current (I$_{SET}$) compared with the bias current (Ibias) that is equal to the feedback current I$_{FB}$. The controller 39 receives a negative saturation signal (C=−1) from the comparator 34 if the bias current (Ibias) is greater than the present predetermined reference current (I$_{SET}$), and changes the signal state of the control signal (CS) from the first signal state (00) into the second signal state (01) to select another predetermined upper limit current (I$_{UL\_SET}$) compared with the feedback current J. Subsequently, the controller 39 receives the negative saturation signal (C=−1) from the comparator 34 again if the bias current (Ibias) is also greater than the present predetermined upper limit current (I$_{UL\_SET}$), with this representing that the bias current (Ibias) is too large to need lowering. Thereafter, the bias current (Ibias) will be lowered by the automatic power control loop 300, and the controller 39 will change the signal state of the control signal (CS) from the second signal state (01) into the first signal state (00). Subsequently, if the controller 39 receives the negative saturation signal (C=−1) continuously, the signal state of the control signal (CS) controlled by the controller 39 will be continually changed between the first signal state (00) and the second signal state (01); moreover, the bias current (Ibias) will be lowered by the automatic power control loop 300 whenever the signal state of the control signal is at the second signal state (01). The lowering process for the bias current (Ibias) is repeated until the controller 39 receives a positive saturation signal (C=+1) in accordance to the comparative result that the adjusted bias circuit (Ibias) is less than the predetermined upper limit current (I$_{UL\_SET}$) or the predetermined reference current (I$_{SET}$), such that the controller 39 can stop the change of the signal state of the control signal (CS). Therefore, the adjusted bias current (Ibias) has been adjusted to the allowable range, so that the light output of the laser diode 38 can be maintained at a constant light intensity.

Figure 5:
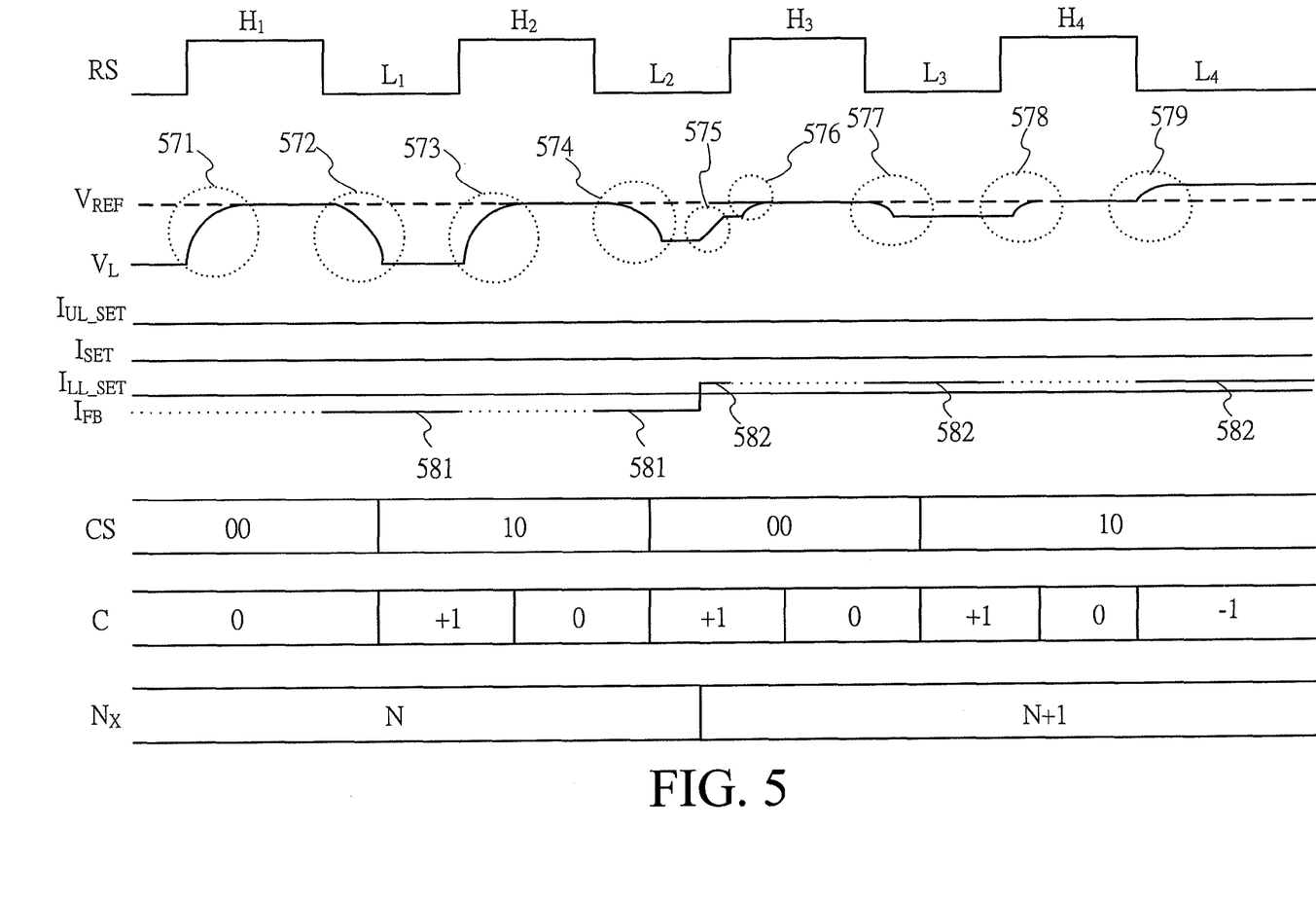
FIG. 5 is a timing diagram for the automatic power control loop according to another embodiment of the present invention.

Referring to FIG. 5, there is shown a timing diagram of the automatic power control loop according to another embodiment of the present invention, accompanying FIG. 2. As shown in FIG. 2 and FIG. 5, in the present invention, the signal state of the control signal (CS) is pre-set as the first signal state (00) by the controlling of the controller 39 in order to pre-select the predetermined reference current (I$_{SET}$) compared with the feedback current I$_{FB}$ before the automatic power control loop 300 proceeds the monitoring process for the light intensity of the laser diode 38.

The automatic power control loop 300 starts the monitoring process for the light intensity of the laser diode 38. Firstly the automatic power control loop 300 will receive a reset signal (RS) with a high-level state (H$_1$) to control the voltage value 571 of the load voltage V$_L$ equal to the reference voltage V$_{REF}$, and the photo diode 32 will not sense the light intensity of the laser diode 38 nor generate any feedback current I$_{FB}$ during the high-level state (H$_1$). Thereafter, the automatic power control loop 300 will receive a reset signal (RS) with a low-level state (L$_1$), and the photo diode 32 will sense the light intensity of the laser diode 38 to generate the current value 581 of the feedback current I$_{FB}$ that is equal to the present bias current (Ibias). The current value 581 of the feedback current I$_{FB}$ will be compared with the predetermined reference current (I$_{SET}$).

In the present invention, the current difference I$_D$ between the current value 581 of the feedback current I$_{FB}$ and the predetermined reference current (I$_{SET}$) will lower the voltage value 572 for the load voltage V$_L$ due to the current value 581 of the feedback current I$_{FB}$ being less than the predetermined reference current (I$_{SET}$). Then, the comparator 24 will output a positive saturation signal (C=+1) according to the comparative result that the lowered voltage value 572 of the load voltage V$_L$ is less than the reference voltage V$_{REF}$. The counter 35 will not proceed the counting operation for the count value (N) while it receives the control signal (CS) to be equal to the first signal state (00) and a positive saturation signal (C=+1). Moreover, the controller 39 records that the current value 581 of the feedback current $I_{FB}$ is less than a predetermined reference current ($I_{SET}$) by first receiving a positive saturation signal (C=+1), at which point the controller 39 changes the signal state of the control signal (CS) from the first signal state (00) into the third signal state (10) to select another predetermined lower limit current ($I_{UL\_SET}$) compared with the current value 581 of the feedback current $I_{FB}$.

The automatic power control loop 300 will receive the reset signal (RS) with the next high-level state ($H_2$) to control the voltage value 573 of the load voltage $V_L$ equal to the reference voltage $V_{REF}$, and the photo diode 32 will not sense the light intensity of the laser diode 38 nor generate any feedback current $I_{FB}$ during the high-level state ($H_2$). Thereafter, the automatic power control loop 300 will receive the reset signal (RS) with the next low-level ($L_2$), and the photo diode 32 will sense the light intensity of the laser diode 38 to generate the current value 581 of the feedback current $I_{FB}$ that will be compared with the predetermined lower limit current ($I_{LL\_SET}$). The current difference $I_D$ between the current value 581 for the feedback current $I_{FB}$ and the predetermined lower limit current ($I_{LL\_SET}$) will lower the voltage value 574 for the load voltage $V_L$ due to the current value 581 for the feedback current $I_{FB}$ still being less than the predetermined lower limit current ($I_{LL\_SET}$). Then, the comparator 24 will output a positive saturation signal (C=+1) according to the comparative result that the lowered voltage value 574 for the load voltage $V_L$ is less than the reference voltage $V_{REF}$. The count value (N) is counted up (such as N=N+1) by the counter 35 while the counter 35 receives the control signal (CS) with the third signal state (10) and a positive saturation signal (C=+1) simultaneously. The laser diode driver 37 will generate a higher bias current (Ibias) by receiving the count value (N=N+1) or the count value (AN=AN+1). The laser diode 38 is operated by the raised bias current (Ibias), and the light intensity of the laser diode 38 will be stronger; further, the photo diode 32 will generate a higher current value 582 of the feedback current $I_{FB}$ by sensing the stronger light intensity of the laser diode 38, and the higher current value 582 of the feedback current $I_{FB}$ will be equal to the raised bias current (Ibias). The current difference $I_D$ between the higher current value 582 of the feedback current $I_{FB}$ and the predetermined lower limit current ($I_{LL\_SET}$) will raise parts of the voltage value 575 for the load voltage $V_L$. In addition, the voltage value 575 of the load voltage $V_L$ is still less than the reference voltage $V_{REF}$, and the comparator 34 will output a positive saturation signal (C=+1) to the controller 39. The controller 39, by again receiving a positive saturation signal (C=+1), will recognize the present bias current (Ibais) that has already adjusted; therefore, the controller 39 will change the signal state of the control signal (CS) from the third signal state (10) into the first signal state (00) to reselect the predetermined reference current ($I_{SET}$) compared with the higher current value 582 of the feedback current $I_{FB}$.

The automatic power control loop 300 will receive the reset signal (RS) with the next high-level state ($H_3$) to control the voltage value 576 of the load voltage $V_L$ equal to the reference voltage $V_{REF}$, and the photo diode 32 will not sense the light intensity of the laser diode 38 nor generate any feedback current $I_{FB}$ during the high-level state ($H_3$). Thereafter, the automatic power control loop 300 will receive the reset signal (RS) with the next low-level ($L_3$), and the photo diode 32 will sense the light intensity of the laser diode 38 to generate the higher current value 582 of the feedback current $I_{FB}$ that will be compared with the predetermined reference current ($I_{SET}$). The current difference $I_D$ between the higher current value 582 of the feedback current $I_{FB}$ and the predetermined reference current ($I_{SET}$) will lower the voltage value 577 of the load voltage $V_L$ due to the higher current value 582 of the feedback current $I_{FB}$ still being less than the predetermined reference current ($I_{SET}$), and then the comparator 24 will output a positive saturation signal (C=+1) according to the comparative result that the lowered voltage value 577 of the load voltage $V_L$ is less than the reference voltage $V_{REF}$.

The counter 35 will not proceed the counting operation for the count value (N=N+1) while it receives the control signal (CS) with the first signal state (00) and a positive saturation signal (C=+1). Moreover, the controller 39, by receiving the positive saturation signal (C=+1), will be recognize that the higher current value 582 of the feedback current $I_{FB}$ is still less than the predetermined reference current ($I_{SET}$), and then the controller 39 will change the signal state of the control signal (CS) from the first signal state (00) into the third signal state (10) to select another the predetermined lower limit current ($I_{LL\_SET}$) compared with the higher current value 582 of the feedback current $I_{FB}$.

The automatic power control loop 300 will receive the reset signal (RS) with the next high-level state ($H_4$) to control the voltage value 578 of the load voltage $V_L$ equal to the reference voltage $V_{REF}$, and the photo diode 32 will not sense the light intensity of the laser diode 38 nor generate any feedback current $I_{FB}$ during the high-level state ($H_4$). Thereafter, the automatic power control loop 300 will receive the reset signal (RS) with the next low-level ($L_4$), and the photo diode 32 will sense the light intensity of the laser diode 38 to generate the higher current value 582 of the feedback current $I_{FB}$ that will be compared with the predetermined lower limit current ($I_{LL\_SET}$). The current difference $I_D$ between the higher current value 582 of the feedback current $I_{FB}$ and the predetermined lower limit current ($I_{LL\_SET}$) will raise the voltage value 579 of the load voltage $V_L$ due to the current value 562 of the feedback current $I_{FB}$ already being greater than the predetermined lower limit current ($I_{LL\_SET}$), and then the comparator 24 will output a negative saturation signal (C=−1) according to the comparative result that the raised voltage value 559 of the load voltage $V_L$ is greater than the reference voltage $V_{REF}$. The controller 39 will stop the change of the signal state of the control signal (CS) by receiving a negative saturation signal (C=−1), at which point the counting process for the count value (N=N+1) can be completed, and therefore the bias current (Ibias) used for operating the laser diode 38 has already been adjusted to an allowable range.

The above content of the present embodiment is simply described as follows: when the automatic power control loop 300 starts the monitoring process for the light intensity of the laser diode 38, the signal state of the control signal (CS) is pre-set as the first signal state (00) by the controlling of the controller 39 in order to pre-select the predetermined reference current ($I_{SET}$) compared with the bias current (Ibias) that is equal to the feedback current $I_{FB}$. The controller 39 receives a positive saturation signal (C=+1) from the comparator 34 if the bias current (Ibias) is less than the present predetermined reference current ($I_{SET}$), and changes the signal state of the control signal (CS) from the first signal state (00) into the third signal state (10) to select another predetermined lower limit current ($I_{LL\_SET}$) compared with the feedback current $I_{FB}$. Subsequently, the controller 39 receives the positive saturation signal (C=+1) from the comparator 34 again if the bias current (Ibias) is also less than the present predetermined lower limit current ($I_{LL\_SET}$), with this representing the bias current (Ibias) is too little to need raising. Thereafter, the bias current (Ibias) will be raised by the automatic power control loop 300, and the controller 39 will change the signal state of the control signal (CS) from the third signal state (10) into the first signal state (00). Subsequently, if the controller 39 receives a positive saturation signal (C=+1) continuously, the signal state of the control signal (CS) controlled by the controller 39 will be continually changed between the first signal state (00) and the third signal state (10); moreover, the bias current (Ibias) will be raised by the automatic power control loop 300 whenever the signal state of the control signal (CS) is at the second signal state (01). The raising process for the bias current (Ibias) is repeated until the controller 39 receives a negative saturation signal (C=−1) according to the comparative result that the adjusted bias current (Ibias) is greater than the predetermined lower limit current ($I_{LL\_SET}$) or the predetermined reference current ($I_{SET}$), such that the controller 39 can stop the change of the signal state of the control signal (CS). Therefore, the adjusted bias current (Ibias) has been adjusted to an allowable range, so that the light output of the laser diode 38 can be maintained at a constant light intensity.

The foregoing description is merely one embodiment of the present invention and is not to be considered restrictive. All equivalent variations and modifications in shape, structure, feature, and spirit in accordance with the appended claims may be made without in any way limiting the scope of the invention.

What is claimed is:

1. An automatic power control loop for adjusting the light intensity of a laser diode, comprising:
    a laser diode, used for receiving a bias current;
    a photo diode, connected to a first node, and used for sensing the light intensity of said laser diode to generate a feedback current that is equal to said bias current;
    a controller, used for outputting a control signal;
    a switch selector, disposed between said first node and a plurality of predetermined currents, comprising a plurality of switches, and connected to said controller to receive said control signal, wherein each of said predetermined currents corresponds to one among said switches respectively, wherein one among said predetermined currents is selected according to said control signal, and one among said switches corresponding to said selected predetermined current is turned on, such that said selected predetermined current is electrically connected to said first node;
    a transducer, connected to said first node, used for receiving a current difference between said feedback current and said selected predetermined current, and transferring said current difference into a load voltage;
    a comparator, connected to said transducer and said controller, and comprising a first input terminal and a second input terminal, wherein said first input terminal of said comparator is connected to a reference voltage, and said second input terminal of said comparator is used for receiving said load voltage, wherein said comparator is used for generating a comparison signal according to the comparison result of said load voltage and said reference voltage, then said comparison signal is transmitted to said controller, and thereby said controller changes the signal state of said control signal according to said comparison signal so as to decide said selected predetermined current;
    a counter, connected to said comparator and said controller to receive said comparison signal and said control signal, and used for recording and counting a count value, wherein said count value is counted up, counted down, or maintained at an original value according to said comparison signal and said control signal; and
    a laser diode driver, connected to said counter and said laser diode, and used for receiving said count value from said counter so as to generate said bias current relative to said count value.

2. The automatic power control loop according to claim 1, wherein there is a digital to analog converter disposed between said counter and said laser diode driver, where said digital to analog converter is used for receiving said count value to convert said count value from a digital form into an analog form, and further transmits said count value with the analog form to said laser diode driver.

3. The automatic power control loop according to claim 1, wherein said comparison signal is a negative saturation signal when said load voltage is greater than said reference voltage, said comparison signal is a zero value signal when said load voltage is equal to said reference voltage, or said comparison signal is a positive saturation signal when said load voltage is less than said reference voltage.

4. The automatic power control loop according to claim 3, wherein said predetermined currents comprise a predetermined reference current, a predetermined upper limit current and a predetermined lower limit current, and the signal state of said control signal comprises a first signal state, a second signal state and a third signal state, wherein said predetermined reference current is connected to said first node when the signal state of said control signal is at the first signal state, said predetermined upper limit current is connected to said first node when the signal state of said control signal is at the second signal state, or said predetermined lower limit current is connected to said first node when the signal state of said control signal is at the third signal state.

5. The automatic power control loop according to claim 4, wherein the signal state of said control signal is pre-set as the first signal state by the controlling of said controller.

6. The automatic power control loop according to claim 5, wherein said controller records that said bias current is greater than said predetermined reference current by receiving said negative saturation signal first, thereafter, if said controller receives said negative saturation signal continuously, the signal state of said control signal controlled by said controller will be continually changed between the first signal state and the second signal state until said controller receives said positive saturation signal; otherwise, said controller records that said bias current is less than said predetermined reference current by receiving said positive saturation signal first, thereafter, if said controller continuously receives said positive saturation signal, the signal state of said control signal will constantly be changed between the first signal state and the third signal state until said controller receives said negative saturation signal.

7. The automatic power control loop according to claim 4, wherein said count value is counted down by said counter when said counter receives said control signal with the second signal state and said negative saturation signal simultaneously, or said count value is counted up by said counter when said counter receives said control signal with the third signal state and said positive saturation signal simultaneously.

8. The automatic power control loop according to claim 1, wherein said transducer receives a reset signal with a high-level state, said first input terminal and said second input terminal of said comparator are connected together through said transducer to control said load voltage equal to said reference voltage.

9. The automatic power control loop according to claim 1, wherein said transducer receives a reset signal with a low-level state, said current difference between said feedback current and said selected predetermined current will flow into said transducer so as to generate said load voltage on said second input terminal of said comparator.

10. The automatic power control loop according to claim 1, wherein said transducer comprises:
   a first transistor, with the source connected to said first node, the drain connected to said second input terminal of said comparator, and the gate used for receiving a reset signal, wherein said first transistor is a PMOS transistor; and
   a second transistor, with the source connected to said first input terminal of said comparator, the drain connected to said second input terminal of said comparator, and the gate used for receiving said reset signal, wherein said second transistor is an NMOS transistor;
   wherein said first transistor is turned off and said second transistor is turned on when said reset signal is at a high-level state, or said first transistor is turned on and said second transistor is turned off when said reset signal is at a low-level state.

11. The automatic power control loop according to claim 3, wherein said comparator sets a predetermined comparative number of times.

12. The automatic power control loop according to claim 11, wherein said comparator generates said negative saturation signal or said positive saturation signal when all comparative results indicate that said load voltage is greater or less than said reference voltage through multiple comparisons for said predetermined comparative number of times, otherwise, said comparator generates said zero value signal.

* * * * *